United States Patent
Wormer et al.

(10) Patent No.: US 7,724,093 B2
(45) Date of Patent: May 25, 2010

(54) PHASE LOCKED LOOP WITH TWO-STEP CONTROL

(75) Inventors: Alexander Wormer, Munich (DE); Harald Sandner, Marzling (DE)

(73) Assignee: Texas Instrumentsdeutschland GmbH, Freising (DE)

( * ) Notice: Subject to any disclaimer, the term of this patent is extended or adjusted under 35 U.S.C. 154(b) by 39 days.

(21) Appl. No.: 12/139,291

(22) Filed: Jun. 13, 2008

(65) Prior Publication Data

US 2008/0309421 A1 Dec. 18, 2008

Related U.S. Application Data

(60) Provisional application No. 61/016,702, filed on Dec. 26, 2007.

(30) Foreign Application Priority Data

Jun. 14, 2007 (DE) ............... 10 2007 027 331

(51) Int. Cl.
*H03L 7/085* (2006.01)
*H03L 7/089* (2006.01)
*H03L 7/099* (2006.01)

(52) U.S. Cl. .................... 331/1 A; 331/11; 331/14; 331/18; 331/25; 375/375; 375/376

(58) Field of Classification Search ............... 331/1 A, 331/11, 14, 18, 25; 375/375, 376
See application file for complete search history.

(56) References Cited

U.S. PATENT DOCUMENTS 4,069,462 A * 1/1978 Dunn ...................... 331/11

(Continued)

FOREIGN PATENT DOCUMENTS

DE 10309335 3/2003

(Continued)

OTHER PUBLICATIONS

"The Design of an All-Digital Phase-Locked Loop With Small DCO Hardware and Fast Phase Lock," IEEE Transactions on Circuits and Systems II: Analog and Digital Signal Processing, vol. 46, No. 7, Jul. 1999 (Jen-Shiun Chiang and Kuang-Yuan Chen), pp. 945-950.

*Primary Examiner*—Arnold Kinkead
*Assistant Examiner*—Richard Tan
(74) *Attorney, Agent, or Firm*—John J. Patti; Wade J. Brady, III; Frederick J. Telecky, Jr

(57) ABSTRACT

A phase locked loop has a digitally controlled oscillator (DCO) for generating a DCO output signal ($f_{OSC}$), a clock divider coupled to the DCO and receiving the DCO output signal and outputting a feedback clock signal ($f_N$), and a phase frequency detector (PFD) coupled to the DCO and controlling the DCO by a DCO control signal ($d_{CNTL}$). The PFD has a first input for receiving the feedback clock signal ($f_N$), a second input for receiving a reference clock signal ($f_{REF}$), and comprises a frequency detection stage (FD) adapted to calculate a frequency difference between the feedback clock signal ($f_N$) and the reference clock signal ($f_{REF}$) in a frequency detection mode and to adjust the DCO control signal based on said frequency difference, a phase detection (PD) stage for calculating a phase error between the feedback clock signal and the reference clock signal in a phase detection mode, and a switch for switching between the frequency detection mode and the phase detection mode upon the frequency of the feedback clock signal reaching a predetermined value.

14 Claims, 1 Drawing Sheet

U.S. PATENT DOCUMENTS

| | | |
|---|---|---|
| 5,511,100 A | 4/1996 | Lundberg et al. |
| 5,727,038 A * | 3/1998 | May et al. .................. 375/376 |
| 6,208,211 B1 * | 3/2001 | Zipper et al. ................. 331/17 |
| 6,310,521 B1 * | 10/2001 | Dalmia ........................ 331/11 |
| 7,127,022 B1 * | 10/2006 | Dieguez ..................... 375/375 |
| 2002/0084815 A1 * | 7/2002 | Murphy et al. .............. 327/157 |
| 2006/0139108 A1 * | 6/2006 | Steinbach et al. ............. 331/16 |

FOREIGN PATENT DOCUMENTS

DE  102004037162  7/2004

* cited by examiner

PHASE LOCKED LOOP WITH TWO-STEP CONTROL

This patent application claims priority from German Patent Application No. 10 2007 027 331.4, filed 14 Jun. 2007, and U.S. Provisional Patent Application No. 61/016,702, filed 26 Dec. 2007, the entireties of which are incorporated herein by reference.

FIELD OF THE INVENTION

The invention generally relates to a phase locked loop. More particularly, the invention relates to a phase locked loop with a digitally controlled oscillator and a phase frequency detector.

BACKGROUND

In order to reduce the costs of future developments of modern communication systems, it is necessary to adapt existing circuits to new silicon processes and higher clock rates with as little effort as possible. With ever increasing clock speeds, it is necessary to build ever higher frequency clock generation circuits for handling clock distribution and synchronization. One example of an application of such circuits is in transmitters and receivers in gigabit Ethernet systems. As digital logic can be adapted more easily to new processes and higher clock rates than analog circuits, there is a general tendency to use digital circuits. Also, analog circuits drift, e.g., as a function of aging and temperature. All digital phase locked loops (ADPLL) are generally suggested to overcome these problems. Yet, known digital PLLs fail to provide a sufficiently quick response (locking) and long term stability.

SUMMARY

It is an object of the invention to provide a phase locked loop that can be used in circuits for generating high frequency clock signals with a low phase error and low drift.

The invention provides a phase locked loop, which includes a digitally controlled oscillator (DCO) for generating a DCO output signal, a clock divider coupled to the DCO for receiving the DCO output signal and outputting a feedback clock signal, and a phase frequency detector (PFD) coupled to the DCO for controlling the DCO by a DCO control signal. The PFD has a first input for receiving the feedback clock signal and a second input for receiving a reference clock signal. Furthermore, the PFD includes a frequency detection stage adapted to calculate a frequency difference between the feedback clock signal and the reference clock signal in a frequency detection mode and to adjust the DCO control signal based on the frequency difference. The PFD further includes a phase detection stage for calculating a phase error between the feedback clock signal and the reference clock signal in a phase detection mode and a switch for switching between the frequency detection mode and the phase detection mode upon the frequency of the feedback clock signal reaching a predetermined value.

According to an aspect of the invention, an at least partially digital phase locked loop is adapted to be controlled in a two-step procedure including a frequency detection mode and a phase detection mode. During the frequency detection mode, the phase locked loop according to the invention uses a successive approximation to calculate the frequency difference between the feedback clock signal derived from the DCO output signal and the reference clock signal, and then adds a correction value to the DCO control signal so that the frequency of the DCO output signal is adjusted stepwise. When the frequency difference between the feedback clock signal and the reference clock signal becomes small enough (e.g., <1 period of the reference clock) during the stepwise adjustment of the DCO output signal, the PFD can then switch from the frequency detection mode to the phase detection mode using the switching means, which can be driven by a controller. Thus, even if the difference in frequency between the output reference signal and the input signal is very large, the phase locked loop is able to achieve a locked state, since the frequency difference between the two signals is always reduced before the phase difference is corrected.

In conventional phase locked loops, the feedback clock signal will not lock to the reference signal if the frequency difference between the two signals is too large. This is because the phase error can only be corrected as long as the phase detection mechanism is capable of determining the amount of phase difference. The typical limit is one period or less of the reference clock signal. Therefore, using the phase locked loop of the invention allows synchronization with the reference clock signal, even if the frequency difference is very high and the phase detection mechanism is limited.

Furthermore, the frequency detection stage can be adapted to count edges of the reference clock signal (positive, negative, or both) and corresponding edges (positive, negative, or both) of the feedback clock signal. Also, the frequency detection stage can be adapted to trigger a frequency adjustment step of the DCO as soon as the number of edges differs by one during a period of the reference clock. Generally, it is possible to determine a frequency difference by counting the edges or periods of the two clock signals to be compared. After a predetermined number of clock periods, the two counts can be compared and the adjustment of the frequency of the DCO can be performed in accordance with the difference. However, according to an aspect of the invention, counting the corresponding edges of the feedback clock signal and the reference clock signal is only performed until a difference of one is detected. The time reference for the comparison is the period of the reference clock. Preferably, only the positive or the negative edges of both clock signals are taken into account. If the number of positive edges of the feedback clock signal is one less than the number of positive edges of the reference clock, the difference between the two clock signals is at least one clock period of the reference clock signal. Accordingly, the DCO oscillation frequency can be adapted by an amount corresponding to at least one clock period of the reference clock signal.

This approach allows the oscillation frequency of the DCO to be adjusted in a stepwise manner without exceeding the frequency of the reference clock signal during the successive approximation procedure. Accordingly, this is a safe way to change the oscillating frequency of the DCO in the frequency detection mode by a step size, which is smaller than the frequency difference. If the maximum frequency difference between reference clock and divided feedback clock is determined, the accuracy (bit width) of two counters can be defined, which are to be used to count the edges of both clock signals. If the counters differ by one (i.e., by one least significant bit (LSB)), than the frequency is to be adjusted. The accuracy of the adjustment is than defined by the LSB of the counters.

In an illustrative embodiment, the digital phase locked loop according to the invention advantageously includes a phase detection stage which is adapted to provide a PD output signal having UP and DOWN pulses in accordance with the sign of the phase error. In this situation, the phase locked loop is adapted to increase the DCO control signal by a predefined step size in response to an UP pulse and to decrease to the DCO signal by the predefined step size in response to a DOWN pulse. This allows a simple implementation of a phase detector to be used, being adapted only to indicate the sign of the phase error and not the magnitude. The step size of the frequency adjustment of the DCO is preferably related to the maximum possible phase error in view of a properly adjusted feedback clock signal during the frequency detection mode. Accordingly, the DCO output signal toggles between two or more frequencies relating to the different DCO control signal values. If the feedback clock signal matches perfectly with the frequency of the reference clock signal of the frequency detection step, the phase detector would provide alternating UP and DOWN pulses. However, due to the restricted resolution of the oscillating frequency of the DCO, which is a general result of the limited resolution of a digital control mechanism, the feedback clock signal would typically not match the frequency and the phase of the reference clock signal. Accordingly, the sequence of UP and DOWN pulses during the phase detection will slightly vary. Yet, a stable average frequency is still achieved.

According to another aspect, the PFD may include a pattern shift stage adapted to monitor the output sequence of the phase detector stage. This can be useful for calculating the average frequency error based on the PD output signal and to correct the DCO control signal so as to compensate for the average frequency error. Preferably, the phase locked loop is adapted to return into the frequency detection mode if the pattern shift stage determines that a length of an UP pulse or a DOWN pulse is longer than half a period of the reference signal. This aspect is particularly helpful for PLL implementations having a simple phase detection stage, which can only indicate the sign of the phase error and not the magnitude. If the phase error becomes too large, the phase detection stage will not be able to compensate the deviation. Such a frequency or a phase error can be caused by a change in the operating conditions (such as temperature or supply voltage). If the fixed step size used to adapt the DCO oscillating frequency during the phase detection mode is chosen to be too small, a large phase error cannot be compensated for any longer. In this situation, the phase locked loop should be capable of returning to the frequency detection mode. Although the phase detection stage is not able to determine a precise length of an UP or a DOWN pulse, it can be determined whether an UP pulse or a DOWN pulse is longer than half a period of the reference signal by using, e.g., a falling edge of the reference clock signal. If the frequency deviation is compensated, the PFD returns to phase detection mode. Also, if during normal operation the average oscillating frequency of the DCO shifts away, the pattern shift stage allows the frequency deviation to be leveled out. This allows the step size used during phase detection mode to be reduced.

Generally, the phase frequency detector according to the invention provides a two-step correction of the feedback clock signal derived from the DCO output signal. Also, the PFD according to the invention allows a phase correction value to be added to the control signal input to the DCO in order to correct the phase error and to calculate the average frequency error by using the pattern shift module so as to add a frequency correction value to the input of the DCO to compensate for the calculated average frequency error. This means that the feedback clock signal can be precisely corrected so as to be synchronized with the reference signal and thus the invention can be used in applications having a wide range of different frequencies. The control mechanism in phase detection mode is a non-linear two-step control. A reduction of the step height provides the advantage of a clear improvement of the dBc value (power of the carrier signal) in the digitally controlled oscillator output spectrum. The pattern shift module is configured to compensate for a drift of the output signal. The drift of the digitally controlled oscillator can be adjusted by the pattern shift module so that the output signal is maintained at the required frequency end phase.

The phase detection module can advantageously be implemented as two flip-flops coupled to an NAND gate, such that an output of each flip-flop forms a corresponding input of the NAND gate and an output of the NAND gate is connected to a reset input of each flip-flop. Thus, the disclosed digital phase locked loop of the invention can be designed so as to correspond to a conventional analog phase locked loop. In this way, existing design libraries and circuit components can be used, which provides the advantage that the costs of implementing the digital phase locked loop circuit are reduced.

A sigma-delta converter may also advantageously be coupled between the PFD and the DCO. The sigma-delta converter preferably has a one-bit output and is connected ahead of the DCO. The ratio of the output pattern of the sigma-delta converter corresponds to the decimal place at its input. The single bit output by the sigma-delta converter is added to the DCO control signal provided by the PFD. Accordingly, the DCO oscillates or toggles around two different DCO control values differing in an LSB. With this pattern, the digitally controlled oscillator is able to generate the desired average frequency. According to another aspect, the digital phase locked loop can include a noise pattern generator for generating a noise pattern for inputting to the sigma-delta converter. This provides a convenient means for canceling unwanted noise generated by the sigma-delta converter.

The invention also provides a method of providing a phase locked clock signal using a digitally controlled oscillator (DCO) for outputting the phase locked clock signal and a phase frequency detector (PFD) coupled to the DCO. The method includes the steps of determining a frequency difference between a feedback clock signal derived from the DCO output signal and a reference clock signal in a frequency detection mode, adjusting the oscillating frequency of the DCO based on the frequency difference, switching from the frequency detection mode to a phase detection mode when the frequency of the feedback clock signal reaches a predetermined value, and calculating a phase error between the feedback clock signal and the reference clock signal in the phase detection mode and adjusting the oscillating frequency of the DCO in response thereto.

An illustrative embodiment of the method of the invention uses a successive approximation to minimize the frequency difference between the feedback clock signal and the reference clock signal in a frequency detection mode. In the frequency detection mode a correction value is added to the DCO control signal input to the DCO step-by-step, i.e., adjusting the frequency of the feedback clock signal takes place gradually. Then, when the frequency difference between the feedback clock signal and the reference clock signal reaches a preset value, which is small enough for a phase correction to take place, the phase frequency detector switches from the frequency detection module to the phase detection module.

The invention provides the advantages of digital clock synchronization circuitry that exhibits less drift over temperature and process fluctuations, better portability to new processes, and better portability to different frequencies than conventional analog solutions. Furthermore, the invention provides a more precise digital phase locked loop with a lower phase error than digital solutions that have already been proposed.

BRIEF DESCRIPTION OF THE DRAWINGS

The new architecture and the benefits of the inventive digital data register will become apparent from the following detailed description of example embodiments with reference to the appended drawings, wherein.

DETAILED DESCRIPTION OF EXAMPLE EMBODIMENTS

Figures 1, 2:
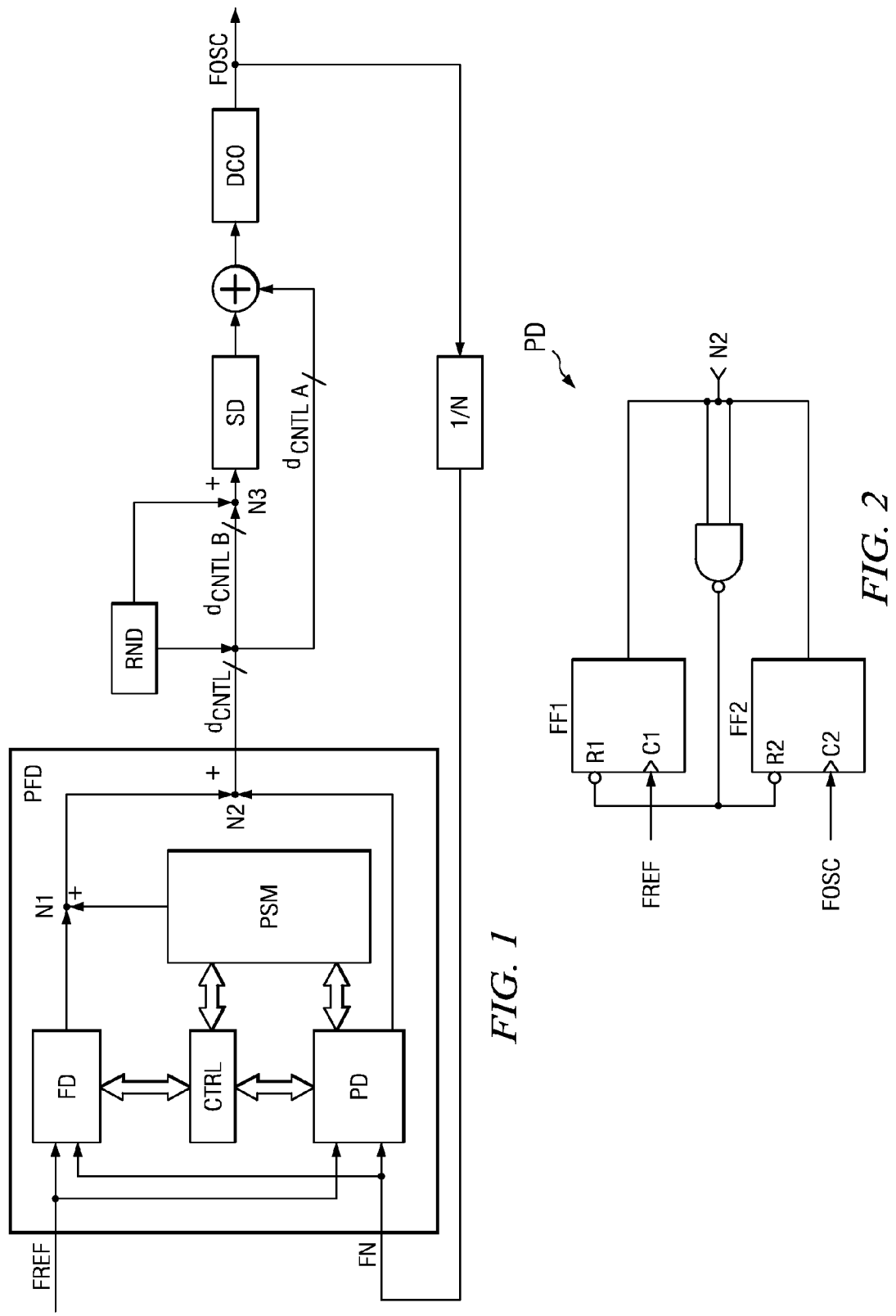
FIG. 1 is a simplified schematic of a digital phase locked loop according to the invention.
FIG. 2 is a simplified schematic of a phase detection module for use in a digital phase locked loop according to the invention.

FIG. 1 shows a simplified schematic of an example implementation of a digital phase locked loop according to the invention. A phase frequency detector PFD is coupled to a digitally controlled oscillator DCO. The digitally controlled oscillator DCO has an 8-bit input and can generate an oscillating output signal $f_{OSC}$ having frequencies between 1 and 1.5 GHz in steps of 1.96 MHz. In order to produce frequencies that lie between these steps, a sigma-delta converter SD with a 1-bit input is connected between the output of the phase frequency detector PFD and the input of the digitally controlled oscillator DCO. This allows the oscillator DCO to produce the average output frequency required in clock synchronization applications. If, for example, the digital phase locked loop shown in FIG. 1 is implemented in a receiver module in an Ethernet system, the output signal $f_{OSC}$ may be used for synchronizing with the signal received from the transmitter. A 1/N divider is connected between the output of the digitally controlled oscillator DCO and the input of the phase frequency detector PFD for dividing the frequency of the feedback clock signal, which is the output clock signal $f_{OSC}$, by an integer multiple so as to be able to compare it with a reference signal $f_{REF}$. The phase frequency detector has two inputs; a first input for receiving the divided feedback clock signal $f_N$, which is the output clock signal $f_{OSC}$ from the digitally controlled oscillator DCO divided by N, and a second input for receiving the reference signal $f_{REF}$, which may be the signal received from a transmitter or other signal with which it is required to achieve synchronization.

The phase frequency detector PFD has a frequency detection module FD, a phase detection module PD and a pattern shift module PSM coupled to the phase detection module PD. A control module CTRL is coupled to the frequency detection module FD, the phase detection module PD and the pattern shift module PSM, and acts as a switch for switching between the frequency detection module FD and the phase detection module PD, and also for controlling the pattern shift module PSM. Both inputs of the phase frequency detector PFD are connected to both the frequency detection module FD and the phase detection module PD. Outputs of the frequency detector FD and the pattern shift module PSM are connected to a node N1. The node N1 and an output of the phase detection module PD are connected to a node N2 at the output of the phase frequency detector PFD. Between the output of the phase frequency detector PFD and the input of the sigma-delta converter SD, a noise pattern generator RND is connected to a node N3 interconnecting the phase frequency detector PFD and the sigma-delta converter SD.

In frequency detection mode, the frequency detection module FD performs a stepwise adjustment of the feedback clock signal $f_N$ (i.e., the divided output signal $f_{OSC}$ output from the oscillator DCO) by comparing the feedback clock signal $f_N$ with the reference clock signal $f_{REF}$. In order to do this, the positive edges of the feedback clock signal $f_N$ and of the reference clock signal $f_{REF}$ are counted by a counter in the frequency detection module FD (in this example, the counter in the frequency detection module has a 11-bit circuit with a counting depth of 2047). As soon as a difference of one between the number of positive edges of the feedback clock signal $f_N$ and the reference clock signal $f_{REF}$ is detected, the digital control signal $d_{CNTL}$ is adapted in order to adjust the DCO oscillation frequency.

The step size of the adjustment is chosen such that the increase of the DCO oscillation frequency is smaller than the actual frequency difference between the feedback clock signal $f_N$ and the reference clock signal $f_{REF}$. As the adjustment is performed as soon as the counter difference is one, the frequency difference corresponds to one period of the reference clock signal or more. Also, the counter difference is a measure for the middle frequency error. However, according to the invention, the correction value based on the middle frequency error can also be determined by the phase detection stage PD, as explained further below. If the difference in frequency between the feedback clock signal $f_N$ and the reference clock signal $f_{REF}$ is small enough (e.g., less than one period of the reference clock signal), the phase locked loop is switched to phase detection mode. Accordingly, the control stage CTRL switches from the frequency detection stage FD to the phase detection stage PD. The phase detection stage PD calculates the phase error in the DCO output signal $f_{OSC}$ and applies a correction signal to the DCO control signal, which is added at node N2. The correction signal compensates for the calculated phase error.

According to an aspect of the invention, the phase control is performed in a non-linear two-step control mechanism. Accordingly, the phase detection stage PD outputs either an UP pulse or a DOWN pulse in accordance with the sign of the phase difference. As no oversampling is used in the phase detection stage PD, the magnitude of the phase error cannot be determined. In response to an UP pulse, the DCO digital control signal $d_{CNTL}$ is increased by a specific digital value. In response to a DOWN pulse, the digital control signal $d_{CNTL}$ is decreased by a specific digital value. The size of the digital value (step size of the two-step control mechanism) is determined, such that a specific deterministic phase noise (i.e. deterministic jitter) is not exceeded. In response to the digital control signal $d_{CNTL}$, the oscillating frequency of the DCO changes quickly around an average value, which is the average output frequency.

As shown, the sigma-delta converter SD is coupled between the PFD and the DCO. The sigma-delta converter SD preferably has a one-bit output and is connected ahead of the DCO. The ratio of the output pattern of the sigma-delta converter SD corresponds to the decimal place at its input. So, the input $d_{CNTLB}$ to the sigma-delta modulator is the lower part of the digital control signal $d_{CNTL}$, which is converted by the sigma-delta modulator SD into a bit stream. The single bit, which is output by the sigma-delta converter SD is added to the upper bits (MSBs) $d_{CNTLA}$ of the DCO control signal provided by the PFD. Accordingly, the DCO oscillates or toggles around two different DCO control values differing by one LSB. Based on this bit pattern the DCO generates the desired average frequency.

Another aspect of the error correction of the DCO output signal $f_{OSC}$ is performed by the pattern shift module PSM, which analyzes the output pattern of the phase detector. The ratio of this pattern is a direct measure of the average frequency error caused by the frequency detection module. The pattern shift module PSM calculates the average frequency error of the DCO output signal $f_{OSC}$, then calculates a correction value to compensate for the frequency error. A correction signal is then added to the DCO control signal, which is input to the oscillator DCO at the node N1 by the pattern shift module PSM. This means that the step height of the two-step control in the phase frequency detector PFD can be reduced, which improves the power value of the carrier signal in the oscillator output spectrum. If the output signal $f_{OSC}$ drifts from the required frequency, the drift of the oscillator DCO is also adjusted by the pattern shift module PSM so as to compensate for drift of the output signal $f_{OSC}$ away from the required frequency.

The illustrated phase locked loop according to the invention is also adapted to switch from the phase detection mode to the frequency detection mode. This is necessary, as the two-step control in the phase frequency detector PFD during phase detection mode can only handle a limited amount of phase error. If the phase error exceeds a specific level, it is necessary to switch back to frequency detection mode in order to adjust the oscillating frequency of the DCO. If, for example, the step size of the frequency adjustment of the DCO during phase detection mode corresponds to 1°, a frequency drift of 5° may not be handled. However, this situation can be detected by monitoring the UP and DOWN pulses output by the phase detection stage PD. If an UP or a DOWN pulse is longer than half a period of the reference clock signal, this indicates that the phase error is too large. Accordingly, the phase frequency detector PFD is switched back to frequency detection mode.

As well as generating the required output pattern for inputting to the oscillator DCO, the sigma-delta converter SD can produce undesired harmonics, which lead to a noisy output at the oscillator DCO. To counteract the effect of these harmonics, the noise generator RND generates a noise pattern, which is added to the least significant bit (LSB) in front of the sigma-delta converter SD at the node N3. This destroys the pattern of the unwanted harmonics and prevents cyclically repeating noise peaks occurring in the output spectrum of the oscillator DCO.

Due to the sigma-delta SD modulator, it is possible that during frequency detection mode the frequency at the output of the DCO will be periodically changed by the SD modulator such that the edges can temporarily be shifted with respect to each other such that a counter difference may occur. This will only happen at the beginning of a counting cycle, e.g., for small counter values. If the phase locked loop tries to control the DCO in response to the assumed frequency difference, the phase locked loop may start oscillating. Accordingly, counting differences below a specific threshold value are ignored. After a specific number of clock cycles, the edges will have shifted with respect to each other and the phase shift caused by the SD modulator cannot cause a counter difference.

The PD architecture may correspond to a phase frequency detection circuit that is used in analog phase locked loops as shown in FIG. 2. Two flip-flops are coupled to a complementary NAND gate such that the output of the NAND gate is connected to both of the reset inputs of the flip-flops. The outputs of the flip-flops are connected to the inputs of the NAND gate. An interconnection of the outputs of both flip-flops also forms the output of the phase detection module PD and is connected to the node N2. The reference signal $f_{REF}$ is input to the clock input of one of the flip-flops and the output signal $f_{OSC}$ is input to the clock input of the other flip-flop.

When the output signal $f_{OSC}$ lags behind the reference signal $f_{REF}$, the phase error is positive, and when the output signal $f_{OSC}$ is ahead of the reference signal $f_{REF}$, the phase error is negative. The sign of the phase error is corrected by the phase detection module PD itself and the magnitude of the phase error (frequency error) is corrected by the pattern shift module PSM, as described above.

While the invention has been described with reference to specific example embodiments, it is not so limited, and other embodiments and variations of embodiments within the scope of the claimed invention will no doubt occur to those skilled in the art to which the invention relates.

What is claimed is:

1. A phase locked loop (PLL) circuit comprising:
   a digitally controlled oscillator (DCO) for generating an output signal; and
   a phase frequency detector (PFD) for providing a control signal to control the oscillator, the PFD having a first input coupled to receive a feedback clock signal representative of the oscillator output signal from the oscillator and a second input coupled to receive a reference clock signal, and wherein the PFD includes:
      a frequency detection stage adapted to calculate a frequency difference between the feedback clock signal and the reference clock signal in a frequency detection mode and to adjust the control signal based on the frequency difference;
      a phase detection stage adapted to calculate a phase error between the feedback clock signal and the reference clock signal in a phase detection mode;
      a switch for switching between the frequency detection mode and the phase detection mode upon a frequency of the feedback clock signal reaching a predetermined value;
      a pattern shift stage that calculating the average frequency error based on a phase detector output signal; and
      a correction means for applying a correction to the control signal so as to compensate for average frequency error.

2. The circuit of claim 1, wherein the frequency detection stage is further adapted to count positive and/or negative edges of the reference clock signal and corresponding positive and/or negative edges of the feedback clock signal, and to cause a frequency adjustment step of the oscillator when the number of edges differs by one during a period of the reference clock.

3. The circuit of claim 2, further adapted to change the oscillating frequency of the oscillator in the frequency detection mode by a step size, which is smaller than the frequency difference.

4. The circuit of claim 3, wherein the phase detection stage is adapted to provide the phase detection output signal having count increasing and count decreasing pulses in accordance with the sign of the phase error, and the phase locked loop is adapted to increase the oscillator control signal by a predefined step size in response to a count increasing pulse and to decrease the control signal by the predefined step size in response to a count decreasing pulse.

5. The circuit of claim 4, wherein the phase locked loop is adapted to return to the frequency detection mode if the pattern shift stage determines that a length of a count increasing pulse or a count decreasing pulse is longer than half a period of the reference clock signal.

6. The circuit of claim 1, wherein the pattern shift stage comprises is adapted for varying the step size.

7. The circuit of claim 3, wherein the phase detection stage comprises two flip-flops and a NAND gate coupled with an output of the NAND gate coupled to a reset input of each flip-flop and an output of each flip-flop coupled to a respective input of the NAND gate.

8. The circuit of claim 7, further comprising a sigma-delta converter coupled between the phase frequency detector and the digitally controlled oscillator.

9. The circuit of claim 7, further comprising a noise pattern generator coupled for providing a random noise pattern at an input of the sigma-delta converter.

10. The circuit of claim 1, further comprising a clock divider coupled to receive the oscillator output signal and output a divided feedback clock signal.

11. A PLL comprising: a DCO; a divider that is coupled to the DCO; a PFD having: a phase detector that is coupled to the divider and that receives a reference signal; a frequency detector that is coupled to the divider and that receives a reference signal; a controller that is coupled to the phase detector and the frequency detector; and a pattern shift circuit that is coupled to the frequency detector and the controller, wherein the pattern shift circuit calculates a frequency error based at least in part on an output from the frequency detector, and wherein the pattern shift circuit applies a correction to compensate for the frequency error.

12. The PLL of claim 11, wherein the PLL further comprises a sigma-delta converter that is coupled between the PFD and the DCO.

13. The PLL of claim 12, wherein the PLL further comprises a noise pattern generator that provides a random noise pattern at an input of the sigma-delta converter.

14. The PLL of claim 11, wherein the phase detector further comprises: a first flip-flop having an input terminal, an output terminal, and a clock terminal, wherein the clock terminal of the first flip-flop receives the reference signal; a second flip-flop having an input terminal, an output terminal, and a clock terminal, wherein the clock terminal of the second flip-flop is coupled to the divider; and a NAND gate that is coupled to the output terminals of each of the first and second flip-flops and that is coupled to the input terminals of the first and second flip-flops.

* * * * *